(12) United States Patent
Shirakawa et al.

(10) Patent No.: US 8,597,732 B2
(45) Date of Patent: Dec. 3, 2013

(54) THIN FILM DEPOSITING METHOD

(75) Inventors: Naoki Shirakawa, Tsukuba (JP);
Yoshiyuki Yoshida, Tsukuba (JP);
Kazuhiko Endo, Tsukuba (JP); Tetsuya Mino, Tokyo (JP)

(73) Assignee: National Institute of Advanced Industrial Science and Technology (JP)

( * ) Notice: Subject to any disclaimer, the term of this patent is extended or adjusted under 35 U.S.C. 154(b) by 925 days.

(21) Appl. No.: 12/531,260

(22) PCT Filed: Mar. 14, 2008

(86) PCT No.: PCT/JP2008/054778
§ 371 (c)(1),
(2), (4) Date: Mar. 23, 2010

(87) PCT Pub. No.: WO2008/114740
PCT Pub. Date: Sep. 25, 2008

(65) Prior Publication Data
US 2010/0178437 A1  Jul. 15, 2010

(30) Foreign Application Priority Data

Mar. 16, 2007  (JP) .................... 2007-068989
Apr. 25, 2007  (JP) .................... 2007-115872
Apr. 25, 2007  (JP) .................... 2007-115882
Feb. 20, 2008  (JP) .................... 2008-038810

(51) Int. Cl.
*C23C 16/06*  (2006.01)

(52) U.S. Cl.
USPC ............. 427/250; 427/255.29; 427/255.7

(58) Field of Classification Search
USPC .......... 427/248.1, 255.23, 255.29, 250, 255.7
See application file for complete search history.

(56) References Cited

U.S. PATENT DOCUMENTS 6,057,238 A * 5/2000 Raina et al. ............... 438/688
2002/0025389 A1* 2/2002 Matsuzawa et al. ........ 427/569
2003/0185980 A1* 10/2003 Endo ....................... 427/255.23
2005/0211956 A1* 9/2005 Kono et al. ................ 252/385
2005/0260345 A1* 11/2005 Lubomirsky et al. ......... 427/240

FOREIGN PATENT DOCUMENTS

| JP | 3-41850 | 2/1991 |
|---|---|---|
| JP | 3-41850 | 4/1991 |
| JP | 4-361151 | 12/1992 |
| JP | 6-25822 | 2/1994 |
| JP | 6-86708 | 3/1994 |
| JP | 2002-116281 | 4/2002 |
| JP | 2005-026400 | * 2/2005 |
| JP | 2005-331339 | 12/2005 |
| JP | 2007-8750 | 1/2007 |

OTHER PUBLICATIONS

Schwartz, P.V., et al., "Oxygen Incorporation during Low Temperature Chemical Vapor Deposition Growth of Epitaxial Silicon Films". J. Electrochem. Soc., vol. 141, No. 5, May 1994, pp. 1284-1290.*
Wei, J., et al., "Deposition of diamond films with controlled nucleation and growth using hot filament CVD". Thin Solid Films, 212 (1992) 91-95.*
Written Opinion re application No. PCT/JP2008/054778, dated Oct. 1, 2009, no page numbers.

* cited by examiner

*Primary Examiner* — Bret Chen
(74) *Attorney, Agent, or Firm* — Husch Blackwell LLP

(57) ABSTRACT

A method comprising: supplying a gas whose water concentration has been controlled to become smaller than 1 PPB, whose oxygen partial pressure has been controlled to become lower than $10^{-21}$ atm by a water/oxygen molecule discharging apparatus into the interior of a reaction chamber and carrying out a dehydration/deoxidation process in the interior of said reaction chamber so as to control water vapor partial pressure to become lower than $10^{-10}$ atm; depositing a metal film on a substrate by supplying a carrier gas or a plasma excitation gas whose water concentration has been controlled to become smaller than 1 PPB, whose oxygen partial pressure has been controlled to become lower than $10^{-21}$ atm into the interior of said reaction chamber; forming an insulating film on the wafer by oxidizing the metal film in a low-oxygen atmosphere whose oxygen partial pressure has been controlled to become lower than $10^{-20}$ atm.

6 Claims, 6 Drawing Sheets

THIN FILM DEPOSITING METHOD

TECHNICAL FIELD

The present invention is related to an apparatus for generating gas having extremely low oxygen concentration, which supplies gas to a semiconductor manufacturing apparatus and the like, while the supplied gas is obtained by making the concentration of oxygen in the gas passing through the solid electrolyte of the apparatus to an extremely low level. The present invention is also related to a processing system and a thin film deposition method therewith, and an inert gas generated as such.

BACKGROUND ART

In generally utilized inert gases such as nitrogen used in industry, oxygen is contained as an impurity although a total amount thereof is very small. This oxygen impurity induces a certain possibility that oxygen molecules cause a problem in such steps that should avoid oxidation in various fields. For instance, oxygen molecules may cause problems when metal thin films are formed by CVD methods, sputtering methods, and the like; when intermetallic compounds are manufactured; when wiring patterns are processed in semiconductor manufacturing steps, and so on.

As to the gases used in the above-described cases, such gases are utilized from which oxygen molecules have already been removed by employing usual methods such as adsorption or absorption of oxygen, catalytic reaction, and the like. However, in the case that such a low oxygen partial pressure that is lower than the oxygen partial pressure obtained by performing the conventional method is required, for example, in such a case that very easily oxidizable substances are handled, the above-explained usual methods are not good enough and thus gases having extremely low oxygen partial pressure are of absolute necessity.

As one of the means capable of generating such extremely low oxygen partial pressure, an oxygen molecule removing apparatus called an "oxygen pump" with employment of solid electrolytes such as strontium-doped lanthanum gallate is already known. There the solid electrolytes having cylinder structures generate gases having high oxygen partial pressures down to low oxygen partial pressures by controlling operating voltages in a feedback manner based upon oxygen partial pressure values acquired from oxygen sensors (Patent Document 1).

Also, other techniques are known (Patent Document 2 and Patent Document 3), by which low oxygen gases obtained by an oxygen pump are fed back to the pump through a return path, realizing even lower oxygen partial pressures which are lower than $10^{-21}$ atm and higher than $10^{-30}$ atm.

Also, in semiconductor manufacturing apparatuses and electric/electronic component manufacturing apparatuses, when these manufacturing apparatuses are vacuum-exhausted from the atmospheric pressure, the below-mentioned method has been employed to realize vacuum conditions having superior qualities without moisture: That is, the manufacturing apparatuses are heated to temperatures from 100° C. to 200° C. while being evacuated so as to heat-remove water content adhered onto wall portions within these manufacturing apparatuses, which are made of stainless steel, aluminum, or the like, to improve the ultimate vacuum. Also, when semiconductor devices and electric/electronic components are manufactured, the below-mentioned method has been employed: That is, performing a thin film deposition process, a heat treatment process, and an etching process in apparatuses where the ultimate vacuum is sufficiently good to make residual water content in semiconductor thin films as low as possible. As a result, degradation of the film, oxidation thereof, and deteriorations of reliability which are caused by water can be avoided. Also, an additional treatment is normally carried out, namely, after the thin film has been deposited, water is heat-removed from the deposited thin film. Moreover, various sorts of structural components which constitute the semiconductor or electric/electronic component manufacturing apparatuses are heat-treated within vacuum baths for sufficient dehydration prior to assembling.

[Patent Document 1] JP-T-10-500450
[Patent Document 2] JP-A-2002-326887
[Patent Document 3] JP-A-2005-331339

DISCLOSURE OF THE INVENTION

Problems to be Solved by the Invention

However, the Patent Documents 2 and 3 have such a problem that an oxygen partial pressure lower than $10^{-30}$ atm is not realized, so that one cannot cope with situations where oxygen partial pressures lower than the said oxygen partial pressure are required.

In the Patent Document 2, the used gas is returned to the oxygen pump. However, if an occurrence of particles from the continuous differential pressure means is taken into account, it is probable that the gas return scheme cannot be utilized in the semiconductor manufacturing step.

In case extremely low oxygen gases are utilized in industry, it is expected that a large amount of such extremely low oxygen gases are required. However, since the known oxygen pumps have to be used in a closed cycle to achieve low enough oxygen partial pressures, there is a problem: That is, since the entire gas capacity is constant, the prior-art oxygen pump system cannot cope with needs for large amounts of extremely low oxygen gases.

In another topic, in semiconductor and electric/electronic component manufacturing, when raw materials are introduced and thin films are deposited therefrom, in particular, water is required to be removed to the allowable limit. However, in accordance with the existing technique, it is impossible to reduce impurity water concentration to lower than 1 PPB. As a consequence, the below-mentioned problems may occur: That is, residual moisture and/or oxygen are present in the films, resulting in more frequent maintenance cycles of the apparatus due to impurity-related particle generation.

Last but not least, in inert gases such as nitrogen generally used in industry, oxygen is contained as an impurity, although a total amount thereof is not much. This oxygen impurity induces a certain possibility that oxygen molecules cause a problem in such steps that should avoid oxidation in various fields, for instance, metal thin film formation by CVD methods, sputtering methods, and the like.

Means for Solving the Problems

One of the objects of the present invention is to achieve lower oxygen partial pressures than by the prior art, with or without the return path of the process gas, to take effect in steps that should avoid oxidation. Another object of the present invention is to provide an extremely low oxygen concentration gas generating apparatus capable of supplying a particle-free, extremely low oxygen concentration gas, which is suitable for industrial applications.

The further object of the present invention is to provide such a thin film deposition method by which one can facilitate dehydration and deoxidation from the surface of a thin film to eliminate water and oxygen molecules effectively and by which both the amounts of water and of oxygen captured into the thin film are lowered to the extreme and furthermore by which it is possible to fundamentally prevent water from mixing into raw materials, with an extremely dry gas as the carrier gas.

An extremely low oxygen concentration gas generating apparatus comprises:

an oxygen molecule discharging apparatus equipped with
  a pair of tube bodies made of metal,
  a solid electrolytic body made of ceramics, which is connected to the metal tube bodies on both ends and has a hollow portion through which the gas sent from the tube body passes,
  an inner electrode, which is provided on the inner surface of the solid electrolytic body, and
  an outer electrode,
  wherein the said tube bodies are made of a metal material whose thermal expansion coefficient is substantially the same as that of the ceramic material constituting the solid electrolytic body, are firmly adhered to the solid electrolytic body in a leak-tight manner, and constitute the inner electrode of the said oxygen molecule discharging apparatus in combination with the said inner electrode of the solid electrolytic body;
a heating apparatus for heating the said oxygen molecule discharging apparatus;
an applying means for applying a voltage between the said electrodes; and
a control apparatus that turns on the application of voltage when the oxygen molecules start to be discharged and controls the partial pressure of oxygen contained in the gas passing through the hollow portion by instructing the said voltage applying means on the voltage to be applied.

The said tube bodies are made of Kovar material having substantially the same thermal expansion coefficient as that of a solid electrolytic body made of zirconia, are firmly adhered to the zirconia solid electrolytic body by means of silver brazing, and constitute the inner electrode of the oxygen molecule discharging apparatus in combination with the inner electrode made of platinum onto the zirconia body.

The said tube bodies are made of Kovar material having substantially the same thermal expansion coefficient as that of a solid electrolytic body made of zirconia and are firmly adhered to the zirconia solid electrolytic body by means of silver brazing, wherein the silver-brazed joints and the tube bodies are covered with an electrolytically-plated layer of either gold or platinum, over which a layer of either gold or platinum is nonelectrolytically plated after the electrolytically-plated portion has been pre-processed with either acid or alkali.

The length of the solid electrolytic body of the extremely low oxygen concentration gas generating apparatus is preferably 20 cm to 60 cm and the length of each of the tube bodies is preferably 3 cm to 60 cm.

A thin film deposition method comprises:

a step in which a gas whose water concentration has been controlled to become smaller than 1 PPB and whose oxygen partial pressure has been controlled to become lower than $10^{-21}$ atm, preferably lower than $10^{-29}$ atm and higher than $10^{-35}$ atm by a water/oxygen molecule discharging apparatus is supplied into the interior of a reaction chamber and a dehydration/deoxidation process is carried out in the interior of the reaction chamber so as to control water vapor partial pressure to become lower than $10^{-10}$ atm; and a step in which a carrier gas or a plasma excitation gas whose water concentration has been controlled to become smaller than 1 PPB and whose oxygen partial pressure has been controlled to become lower than $10^{-21}$ atm, preferably lower than $10^{-29}$ atm and higher than $10^{-35}$ atm and reaction gases are supplied into the interior of the reaction chamber so as to deposit a thin film on a substrate.

A thin film deposition method comprises:

a step in which a gas whose water concentration has been controlled to become smaller than 1 PPB and whose oxygen partial pressure has been controlled to become lower than $10^{-21}$ atm, preferably lower than $10^{-29}$ atm and higher than $10^{-35}$ atm by a water/oxygen molecule discharging apparatus is supplied into the interior of a reaction chamber and a dehydration/deoxidation process is carried out in the interior of the reaction chamber so as to control water vapor partial pressure to become lower than $10^{-10}$ atm; and a step in which a carrier gas or a plasma excitation gas whose water concentration has been controlled to become smaller than 1 PPB and whose oxygen partial pressure has been controlled to become lower than $10^{-21}$ atm, preferably lower than $10^{-29}$ atm and higher than $10^{-35}$ atm and organometallic compounds are supplied into the interior of the reaction chamber so as to deposit an insulating film having a high permittivity on a substrate.

The said thin film deposition method further comprises: a step for performing a heating process within a gas whose water concentration has been controlled to become smaller than 1 PPB and whose oxygen partial pressure has been controlled to become lower than $10^{-21}$ atm, preferably lower than $10^{-29}$ atm and higher than $10^{-35}$ atm on the metal film which is a precursor of a high-permittivity insulating film, after it has been deposited.

The said thin film deposition method further comprises: a step to thermally oxidize the deposited film by employing an inert gas whose water concentration has been controlled to become smaller than 1 PPB and whose oxygen partial pressure has been controlled to become the value wherein only the deposited metal film is oxidized, leaving the substrate unoxidized or deoxidizing the oxide substrate.

A method for measuring water content contained in a gas that has been dehydrated according to the present invention comprises:

a step for measuring both the hydrogen partial pressure and water vapor partial pressure of the gas before the dehydration process is carried out;

a step for measuring the oxygen partial pressure of the gas after both water and oxygen molecules have been discharged; and a step for calculating the water content after the dehydration process has been carried out, based upon a thermodynamic calculation by employing the below-mentioned chemical equilibrium of the system composed of water, hydrogen, and oxygen, $$\frac{p(H_2O)}{p(H_2)p(O_2)^{1/2}} = K_p \qquad \text{[Formula 1]}$$

where the value of "$K_p$" at the temperature of 600° C. is $8.69 \times 10^{11}$ [atm$^{-1/2}$].

In the said method for measuring the water content in the gas, the gas may be predried with a conventional filter prior to the said dehydration process.

DESCRIPTION OF REFERENCE NUMERALS AND SIGNS

Figure 1:
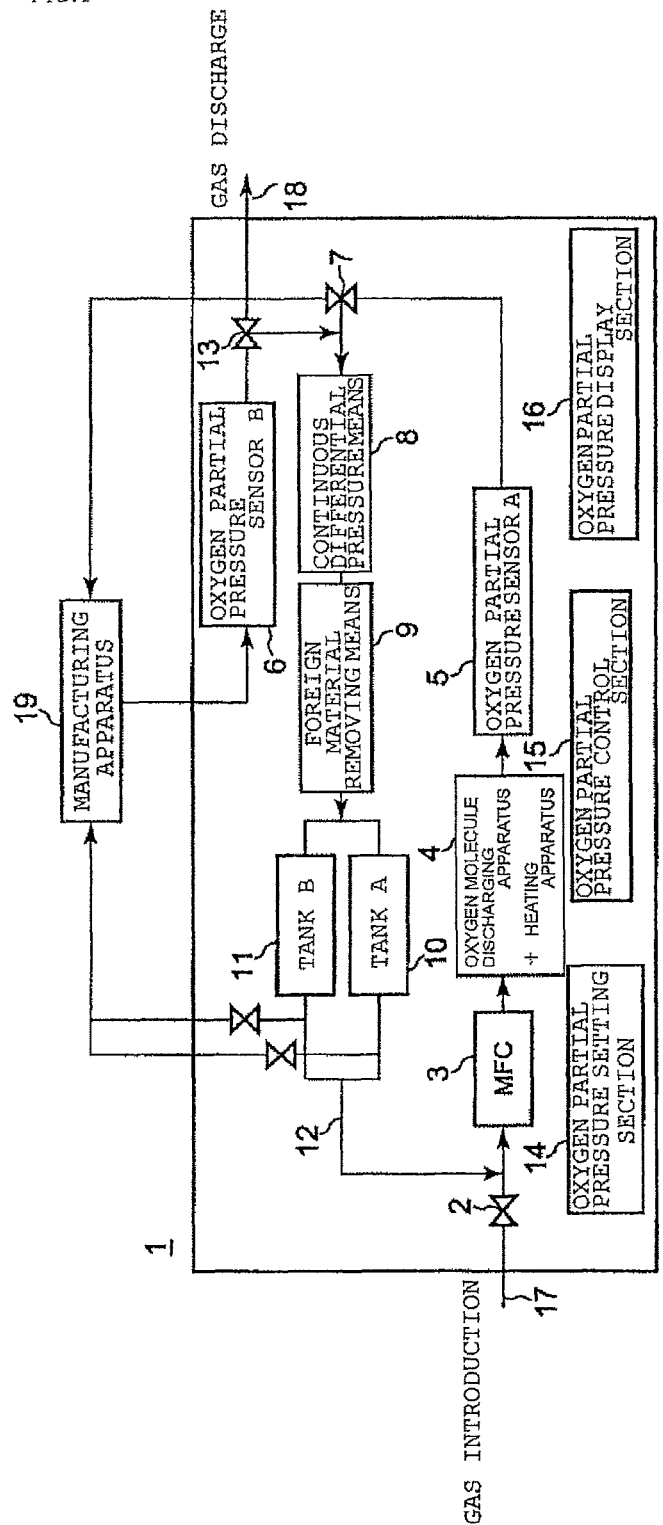
FIG. 1 is a schematic structural diagram showing a flow path of gas having extremely low oxygen concentration in an apparatus for generating gas having extremely low oxygen concentration, according to the present invention.

1 Extremely low oxygen concentration gas generating apparatus
2 Valve
3 Mass flow controller
4 Oxygen molecule discharging apparatuses with a heating apparatus
7 Three-way valve
12 Return path
13 Three-way valve
20 Tube body
21 Solid electrolyte tube
22 Inner electrode
23 Outer electrode
24 Silver brazing
25 Housing for oxygen molecule discharging apparatuses
26 Oxygen molecule discharging apparatus
27 Heating apparatus
28 Oxygen exhaust path
101 Trench
102 Substrate
103 Well
104 Thermal oxidation film
105 High permittivity insulating film
106 Gate-electrode material
107 Gate electrode
108 Sidewall protective film
109 Source/drain region
201 vacuum reaction chamber
202 heater
203 wafer
204 water molecule/oxygen molecule discharging apparatus
205 vacuum pump
206 load lock chamber
207 organometallic material cylinder Best Mode for Carrying Out the Invention Referring now to drawings, a description is made of embodiment of the present invention.

FIG. 1 indicates a diagram of a gas flow path for supplying gas having extremely low oxygen concentration to an apparatus for manufacturing a semiconductor and the like, according to the present invention, while the extremely low oxygen concentration gas has an extremely low oxygen partial pressure whose oxygen concentration is $1\times10^{-20}$ to $1\times10^{-35}$ atm. In FIG. 1, the gas flow path is equipped with an on-off valve 2, a mass flow controller 3, and an apparatus 4 for generating gas having extremely low oxygen concentration, an oxygen sensor 5, and a manufacturing apparatus 19. The on-off valve 2 opens/shuts a supply of gas introduced from an introduction port 17 of gases such as inert gases. The mass flow controller 3 controls a flow rate of the gas being passed through the on-off valve 2 at a set value. The extremely low oxygen concentration gas generating apparatus 4 discharges oxygen molecules from the gas being passed through the mass flow controller 3 out to the exterior so as to generate a gas having extremely low oxygen concentration. The oxygen sensor 5 monitors the oxygen partial pressure of the extremely low oxygen concentration gas having the extremely low oxygen partial pressure, generated by the extremely low oxygen concentration gas generating apparatus 4. The manufacturing apparatus 19 introduces the gas manufactured by the extremely low oxygen concentration gas generating apparatus so as to manufacture a semiconductor and the like.

An oxygen concentration control apparatus of extremely low oxygen partial pressure gas is equipped with an oxygen partial pressure setting section 14, a PID control type oxygen partial pressure control section 15, and an oxygen partial pressure display section 16. The oxygen partial pressure setting section 14 accepts a desired oxygen partial pressure value. The PID control type oxygen partial pressure control section 15 compares the value monitored by either the supply-side oxygen partial pressure sensor 5 or the exhaust-side oxygen partial pressure sensor 6 with the value set by the oxygen partial pressure setting section 14 so as to control the partial pressure of oxygen contained in the gas outputted from the extremely low oxygen concentration gas generating apparatus 4 to a predetermined value. The supply-side oxygen partial pressure sensor 5 measures the oxygen partial pressure of the extremely low oxygen concentration gas which is to be supplied to the manufacturing apparatus 19. The exhaust-side oxygen partial pressure sensor 6 measures the oxygen partial pressure of the extremely low oxygen concentration gas which has been exhausted from the manufacturing apparatus. The oxygen partial pressure display section 16 displays thereon the oxygen partial pressure target value set by the oxygen partial pressure setting section 14, the monitored value sensed by the supply-side oxygen sensor 5, and the monitored value sensed by the exhaust-side oxygen sensor 6.

In the case that the extremely low oxygen concentration gas outputted from the extremely low oxygen concentration gas generating apparatus 4 is directly supplied to the manufacturing apparatus 19, the valve 7 located downstream of the supply-side oxygen partial pressure sensor 5 is opened so as to supply the extremely low oxygen concentration gas to the manufacturing apparatus 19. As a consequence, in the manufacturing apparatus 19 one can manufacture a semiconductor and the like under extremely low oxygen partial pressure. The extremely low oxygen concentration gas which has been already used in this manufacturing apparatus 19 is sent out to the valve 13 through the exhaust-side oxygen partial pressure sensor 6. The said valve 13 selects whether or not the extremely low oxygen concentration gas is returned to the extremely low oxygen concentration gas generating apparatus.

In the case that the extremely low oxygen concentration gas which has been used in the manufacturing apparatus is returned to the extremely low oxygen concentration gas generating apparatus 4 and then is again introduced to the extremely low oxygen concentration gas generating apparatus, the extremely low oxygen concentration gas which has already been used in the manufacturing apparatus 19, whose oxygen partial pressure value is monitored by the exhaust-side oxygen partial pressure sensor 6, is returned to the extremely low oxygen concentration gas generating apparatus 4 by passing a return piping 12 through a continuous differential pressure means 8, a foreign material removing means 9 for removing foreign materials in the returned gas, a tank=A 10, and another tank=B 11. At this time, if an occurrence of foreign materials in the manufacturing apparatus 19 is considered, then it is desirable to mount another foreign material removing means for removing foreign materials between the valve 13 and the continuous differential pressure means 8.

In this case, the extremely low oxygen concentration gas generating apparatus can generate a gas having an oxygen concentration whose partial pressure of oxygen is set to $1\times10^{-20}$ to $1\times10^{-35}$ atm.

On the other hand, in the case that the extremely low oxygen concentration gas which has been used in the manufacturing apparatus 19 is not returned to the extremely low oxygen concentration gas generating apparatus 4, the gas is passed from the valve 13 to a gas exhaust port 18 to be directly exhausted outside the system. In this case, the extremely low, oxygen concentration gas generating apparatus can generate a gas having an oxygen concentration whose partial pressure of oxygen is set to lower than $10^{-21}$ atm and higher than $10^{-30}$ atm.

Next, in the case that the extremely low oxygen concentration gas outputted from the extremely low oxygen concentration gas generating apparatus 4 is not directly flowed to the manufacturing apparatus 19, but is once stored in the tank-A 10 and the tank-B 11 prior to usage, the extremely low oxygen concentration gas of the amount defined by the volume of the tanks times the pressure generated at the back of the continuous differential pressure means 8 up to the mass flow controller 3 can be stored via the valve 7 located just downstream of the supply-side oxygen partial pressure sensor 5. The extremely low oxygen concentration gas controlled to the predetermined oxygen partial pressure by circulating the gas may be supplied to the manufacturing apparatus 19.

Figure 2:
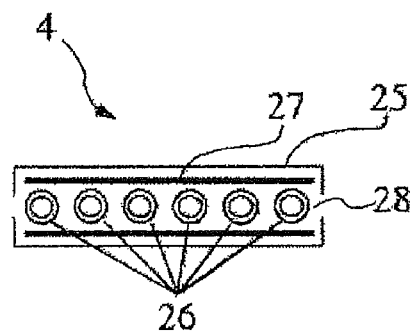
FIG. 2 is a sectional view schematically showing an arrangement in which six sets of the oxygen discharging apparatuses according to the present invention have been arranged in a parallel manner.

FIG. 2 is a sectional view showing the extremely low oxygen concentration gas generating apparatus. The extremely low oxygen concentration gas generating apparatus 4 is provided with a rectangular-shaped chamber 25, oxygen molecule discharging apparatuses 26 arranged within the said rectangular-shaped chamber, a heating apparatus 27, and an oxygen molecule exhaust path 28. The heating apparatus heats the oxygen molecule discharging apparatuses. Oxygen molecules discharged from the oxygen molecule discharging apparatus 26 and carried by air flow are exhausted through the oxygen molecule exhaust path 28.

Figure 3:
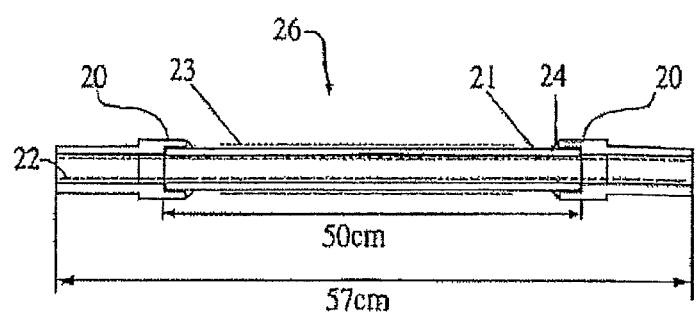
FIG. 3 is a plan view representing a major portion of the oxygen molecule discharging apparatus according to the present invention.

FIG. 3 is a schematic diagram of a major portion representing the oxygen molecule discharging apparatus which constitutes the extremely low oxygen concentration gas generating apparatus of FIG. 2.

The oxygen molecule discharging apparatus 26 is equipped with a solid electrolytic body 21 made of zirconia and network-structured electrodes 22 and 23. The solid electrolytic body 21 has oxygen-ion conductivity. The network-structured electrodes 22 and 23 are attached on both the inner surface and outer surface of the solid electrolytic body 21, and are made of either gold or platinum. Both ends of the solid electrolytic body 21 made of zirconia are firmly adhered to the metal tube bodies 20 made of Kovar material by silver brazing. The inner electrode of the solid electrolytic body and the tube body constitute the entire inner electrode. The internal pressure of the extremely low oxygen concentration gas generating apparatus is lower than 3 Kg/cm² in gauge pressure and is normally equal to 0.1 through 1.0 Kg/cm² in gauge pressure.

Figure 4:
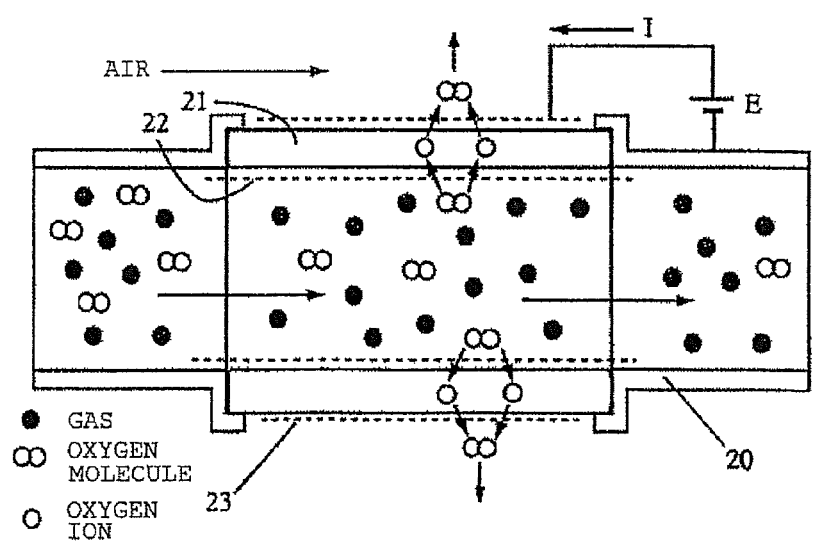
FIG. 4 is a sectional view of a schematic structure describing the operation principle of the oxygen molecule discharging apparatus according to the present invention.

FIG. 4 is a schematic diagram indicating operations of the oxygen molecule discharging apparatus 26. When a voltage of 2 V of a DC power supply "E" is applied between the electrodes 22 and 23 of the oxygen molecule discharging apparatus 26 so as to flow a current "I", oxygen molecules contained in a gas which flows through a hollow portion of the solid electrolytic body are ionized at the inner electrode of the solid electrolytic body, thus formed oxygen ions are transported from the inner side of the solid electrolytic body to the outer side thereof thanks to the oxygen ion conductivity of the solid electrolyte, and then thus transported oxygen ions are released out of the solid electrolytic body. As previously described, the extremely low oxygen partial pressure gas generating apparatus discharges the oxygen molecules contained in the gas to the atmosphere as the gas introduced into the solid electrolytic body 21 passes through the hollow portion of the solid electrolytic body 21 so as to generate an extremely low oxygen concentration gas having an extremely low oxygen partial pressure and to supply it from the solid electrolytic body to the manufacturing apparatus. In FIG. 4, symbol "●" indicates the base gas molecule, symbol "○○" denotes an oxygen molecule, and symbol "○" shows an oxygen ion.

As to the solid electrolyte which constitutes the said solid electrolytic body 21, for instance, zirconia series may be utilized which are expressed by a general formula of $(ZrO_2)_{1-x-y}(In_2O_3)_x(Y_2O_3)_y$, (0<x<0.20, 0<y<0.20, and 0.08<x+y<0.20). Among these zirconia series, it is preferable that x=0 and 0<y<0.2. In addition, it is more preferable that x=0 and 0.06<y<0.12.

As to the solid electrolyte, in addition to the above-exemplified zirconia series, the below-mentioned solid electrolytes may be employed: That is, for example, a complex oxide containing Ba and In, in which a portion of Ba of this complex oxide has been substituted with La, in particular, those in which an atomic ratio of {La/(Ba+La)} is set at larger than or equal to 0.3, and in addition, those in which a portion of In has been substituted with Ga; solid electrolytes expressed by the general formula of $\{Ln_{1-x}Sr_xGa_{1-(y+z)}Mg_yCo_zO_3$, where Ln=either one or both of La and Nd, x=0.05 to 0.3, y=0 to 0.29, Z=0.01 to 0.3, and y+z=0.025 to 0.3}; solid electrolytes expressed by the general formula of $\{Ln_{(1-x)}A_xGa_{(1-y-z)}B1_yB2_zO_{3-d}$, where Ln=either one or more of La, Ce, Pr, Nd, and Sm, A=either one or more of Sr, Ca, Ba, B1=either one or more of Mg, Al, In, and B2=either one or more of Co, Fe, Ni, Cu}; solid electrolytes expressed by the general formula of $\{Ln_{2-x}M_xGe_{1-y}L_yO_5$, where Ln=either one or more of La, Ce, Pr, Sm, Nd, Gd, Yd, Y, and Sc, M=either one or more of Li, Na, K, Rb, Ca, Sr, and Ba, L=either one or more of Mg, Al, Ga, In, Mn, Cr, Cu, Zn}; solid electrolytes expressed by the general formula of $\{La_{(1-x)}Sr_xGa_{(1-y-x)}Mg_yAl_2O_3$, where 0<x≤0.2, 0<y≤0.2, and 0<z<0.4}; solid electrolytes expressed by the general formula of $\{La_{(1-x)}A_xGa_{(1-y-z)}B1_yB2_zO_3$, where Ln=either one or more of La, Ce, Pr, Sm, and Nd, A=either one or more of Sr, Ca, and Ba, B1=either one or more of Mg, Al, and In, B2=either one or more of Co, Fe, Ni, and Cu, x=0.05 to 0.3, y=0 to 0.29, z=0.01 to 0.3, and y+z=0.025 to 0.3}; and the like.

The degree of air-tightness between both ends of the said solid electrolytic body and the tube bodies may give a large influence on oxygen partial pressure. In order to achieve enough ion conductivity, the solid electrolyte must be heated. Conventionally, the air-tightness at the both ends has been maintained with O rings or an adhesive agent for vacuum components and these end portions have been cooled by air or the like in view of the heat weakness thereof. However, sufficiently high air-tightness could not be achieved. The present invention chooses to joint the tube bodies and the solid electrolytic body with metal brazing as a sealing means between the tube bodies and the both ends of the solid electrolytic body. As a result, the heat resistance is improved. Accordingly, a better air-tightness is achieved, so that even lower oxygen partial pressure gas can be obtained.

For the sake of improving the discharging speed of the oxygen molecule discharging apparatus 26, the larger the number of the solid electrolytic bodies is and the longer they are, the better. A longer solid electrolytic body also helps improve the heat resistance because the sealing part can be placed farther away from the hot zone. As a result, the heat resistance of the tube body connection may not be a concern. However, if cost and handling aspects of solid electrolytic bodies are considered, then it is preferred that these solid electrolytic bodies have lengths of 15 cm up to 60 cm at most. It is also desired that lengths of each tube body on one side be 3 cm up to 60 cm at most.

The sealing structure capable of maintaining a tight seal between the tube body and the end of the solid electrolytic body is formed in the following method.

That is, both end portions of the solid electrolytic body are firmly adhered to the tube bodies by silver brazing. Next, the silver-brazed portions and the metal tube bodies are electrolytically plated with either gold or platinum. Then, the electrolytically-plated portions are pre-processed with either acid or alkali, and thereafter, nonelectrolytic plating is performed over the said pre-processed surface and over the entire solid electrolytic body as well.

Similarly, as to the solid electrolyte which is utilized in the oxygen sensor, it is preferable to use a brazing method for the sealing means for the sake of air-tightness between the solid electrolyte and tube bodies. If the porous platinum electrode is formed in accordance with the electrode shape of the Patent Document 3, oxygen partial pressures can be directly calculated with the Nernst equation based upon thermodynamics.

When the sealing structure capable of maintaining a tight seal between the tube bodies and the end portions of the solid electrolytic body is formed as previously explained, analysis results show that the amounts of metal contamination contained within the gas having passed through the extremely low oxygen concentration gas generating apparatus and within the gas outputted from the extremely low oxygen concentration gas generating system equipped with all the piping are both smaller than the detection limit. As to the analyzing method, argon gas is passed through the solid electrolytic body connected to one pair of the metal tube bodies and thereafter, the argon gas is further passed into distilled water so as to collect metal particles contained in the gas into the distilled water. Subsequently, the collected metal particles contained in the distilled water are analyzed based upon the ICP-MS method (namely, inductively-coupled-plasma mass spectroscopy method). The analysis results are given as follows:

Fe, Cr, Ni, Al, Ag, Cu, and Pt contained in the extremely low concentration gas generating apparatus are all less than 1 ng/m$^3$. Also, Fe, Cr, Ni, Al, Ag, Cu, and Pt contained in the gas from the extremely low concentration gas generating system equipped with all the piping are all less than 1 ng/m$^3$.

Water content: the inert gas having a water concentration less than 1 PPB and larger than 0.83 PPT is achieved.

The oxygen molecule discharging apparatus 26 which constitutes the extremely low oxygen concentration gas generating apparatus takes discharging effects capable of discharging both water and oxygen molecules and performs the below-mentioned water partial pressure control operation: That is, one introduces the gas processed with the extremely low oxygen concentration gas generating apparatus into the reaction chamber and performs dehydration/deoxidation process within the reaction chamber in order to control water vapor partial pressure at lower than $10^{-10}$ atm. In the said gas processed with the extremely low oxygen concentration gas generating apparatus, the concentration of water has been controlled to be lower than 1 PPB and the partial pressure of oxygen has been controlled to be lower than $10^{-21}$ atm, preferably lower than $10^{-29}$ atm and higher than $10^{-35}$ atm.

In a vacuum reaction chamber for a semiconductor and the like, a material gas is introduced from an organometallic material cylinder 207, and then a thin film is deposited on a wafer 203 under an extremely low water/oxygen content condition in which the water concentration is controlled to be smaller than 1 PPB and the partial pressure of oxygen is controlled to be lower than $10^{-21}$ atm, preferably lower than $10^{-29}$ atm and higher than $10^{-35}$ atm by a water/oxygen molecule discharging apparatus 204.

A method for measuring water content contained in a gas that has been dehydrated with the water/oxygen molecule discharging apparatus comprises the below-mentioned steps, namely, a step for measuring both the hydrogen partial pressure and water partial pressure of a gas before the dehydration process is carried out; a step for measuring oxygen partial pressure of the gas after the dehydration process is carried out; and a step for calculating water content after the said dehydration process is carried out based upon a thermodynamic calculation by employing the below-mentioned chemical equilibrium of the system composed of water, hydrogen, and oxygen, $$\frac{p(H_2O)}{p(H_2)p(O_2)^{1/2}} = K_p \quad \text{[Formula 2]}$$

where symbol "$K_p$" indicates the equilibrium constant.

[Embodiment 1]

Figure 5:
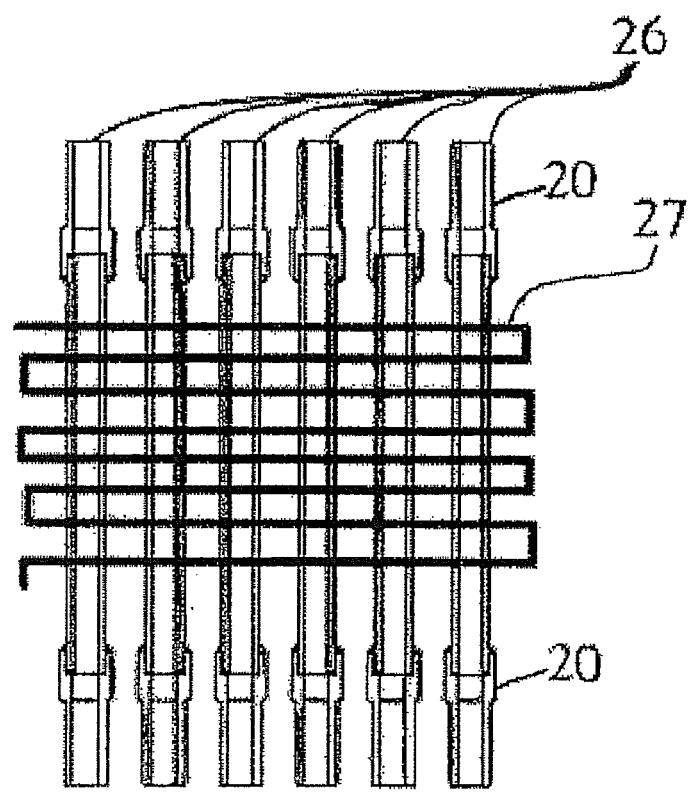
FIG. 5 is a plan view schematically showing an arrangement in which six sets of the oxygen discharging apparatuses according to the present invention have been arranged in a parallel manner.

In the present embodiment, as shown in FIGS. 3 and 5, six zirconia tubes whose length is 50 cm are employed as a solid electrolytic body, into which 6 mol % yttria has been doped. For the sake of air-tightness between the tube bodies 20 and the zirconia tubes 21, the tube bodies 20 are joined to the zirconia tubes 21 by way of silver brazing in order to improve strength and heat resistance. The six zirconia tubes are mutually arranged in a parallel manner. Heaters are placed in front and back of the zirconia tubes.

Argon gas is introduced from the gas introduction port and then the flow rate of the introduced argon gas is set to 2 L/min. by the mass flow controller. A voltage of 2 V is applied between the electrodes of the oxygen molecule discharging apparatus 26 heated to a temperature of 600° C. Air is flowed as a purge gas on the outer side of the solid electrolytic body.

Then the gas which is passed through the zirconia tubes within the oxygen molecule discharging apparatus and whose oxygen partial pressure is lowered is introduced to the oxygen sensor so as to measure the lowered oxygen partial pressure. In order to measure the oxygen partial pressure, electromotive force which is produced by a concentration cell reaction in connection with a difference in oxygen partial pressure between inside and outside the solid electrolytic body is measured. At this time, the oxygen partial pressure indicates $4.6\times10^{-28}$ atm after approximately 2 hours. The present embodiment corresponds to the case that the extremely low oxygen concentration gas used in the manufacturing apparatus is not returned to the extremely low oxygen concentration gas generating apparatus 4.

Subsequently, in the present apparatus, argon gas is introduced from the gas introduction port and then the flow rate of the introduced argon gas is set to 2 L/min. by the mass flow controller. A voltage of 2 V is applied between the electrodes of the oxygen molecule discharging apparatus which has already been heated at a temperature of 600° C. Air is flowed as a purge gas on the outer side of the solid electrolytic body.

Then the gas is similarly passed through the solid electrolytic body and the oxygen sensor. In the present embodiment, the gas whose oxygen partial pressure has been lowered is returned to the solid electrolytic body. With a diaphragm pump as the continuous differential pressure means for returning the gas and a particle filter as the foreign particle removing means, the gas is passed through the diaphragm pump and particle filter and then returned to the oxygen molecule discharging apparatus. The returned low oxygen partial pressure gas is passed through the oxygen molecule discharging apparatus many times. In the present embodiment, while the tank is not utilized, the gas path bypasses the tank. When oxygen partial pressure is measured after approximately 2 hours has elapsed, the measured oxygen partial pressure indicates $3.3\times10^{-34}$ atm.

In a further embodiment, argon gas is introduced from the gas introduction port and then the flow rate of the introduced argon gas is set to 2 L/min. by the mass flow controller. A voltage of 2 V is applied between the electrodes of the oxygen molecule discharging apparatus which has already been heated at a temperature of 600° C. Air is flowed as a purge gas on the outer side of the solid electrolytic body.

Then the gas is similarly passed through the solid electrolytic body and the oxygen sensor. In the present embodiment, the gas whose oxygen partial pressure has been lowered is returned in substantially the same method as that of in the previous embodiment except that two 39-liter tanks are used this time. While the gas is passed through the oxygen molecule discharging apparatus many times, the gas is pressurized to 4 atm in these tanks. The oxygen partial pressure within the tanks indicates $2.1\times10^{-31}$ atm approximately 2 hours after the gas has filled the tanks.

[Embodiment 2]

Figure 6:
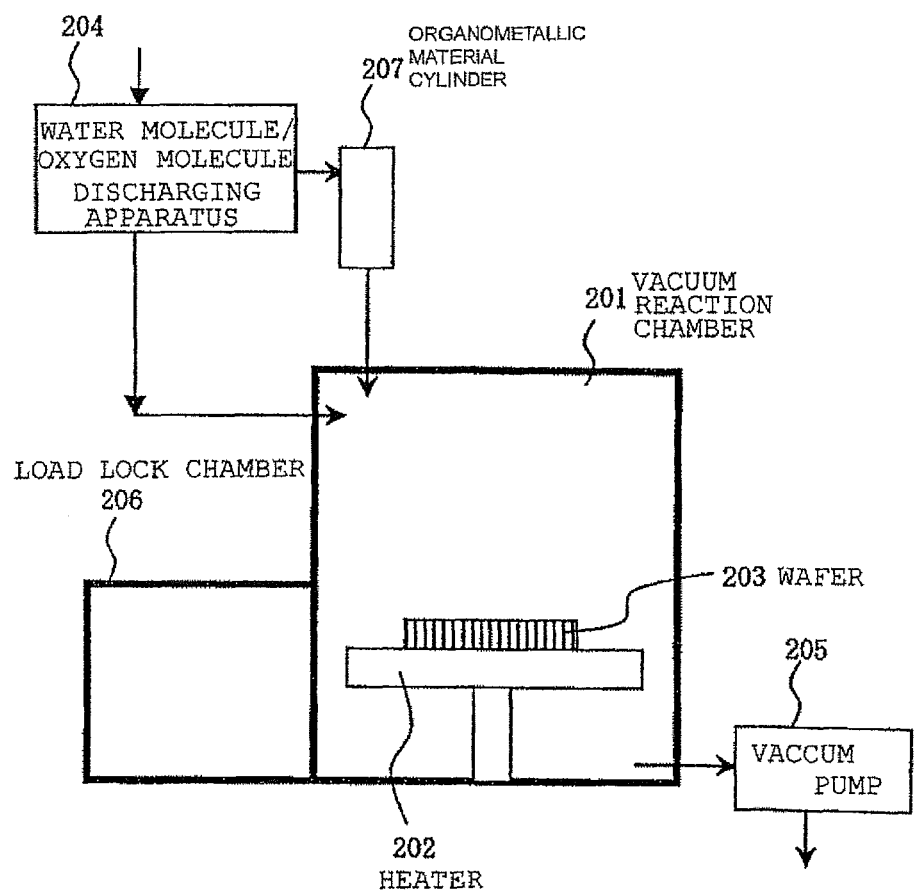
FIG. 6 is a schematic diagram indicating a thin film depositing apparatus.

FIG. 6 is a schematic diagram showing a thin film depositing apparatus for depositing thin films for a semiconductor and electric/electronic components. The thin film depositing apparatus is equipped with a vacuum reaction chamber 201, a supporting table having a heater 202 provided in the vacuum reaction chamber, a wafer 203 mounted on the heater 202, a load lock chamber 206, and a vacuum pump 205. The heater provided in the vacuum reaction chamber is used in a deposition process of a thin film and a heating process of the thin film. Furthermore, the thin film depositing apparatus is provided with a water/oxygen molecule discharging apparatus 204, which discharges water and oxygen molecules from source gases in an electrochemical manner.

One introduces a process gas of which the water/oxygen molecule discharging apparatus 204 has controlled the moisture content at lower than 1 PPB and the oxygen partial pressure at lower than $10^{-21}$ atm, preferably lower than $10^{-29}$ atm and higher than $10^{-35}$ atm into the reaction chamber to dehydrate/deoxidize the said chamber and controls the water vapor pressure at lower than $10^{-10}$ atm.

Into the vacuum reaction chamber, a source gas is introduced from the organometallic material cylinder 207, and then a thin film is deposited on the wafer 203 under such an extremely low water content/oxygen partial pressure condition in which the water concentration is controlled to be smaller than 1 PPB and the partial pressure of oxygen is controlled to be lower than $10^{-21}$ atm, preferably lower than $10^{-29}$ atm and higher than $10^{-35}$ atm by the water/oxygen molecule discharging apparatus 204.

A detailed description is made of a method for depositing an insulating film having a high permittivity on a wafer by employing the thin film depositing apparatus described in FIG. 6. Partial pressure of water vapor and that of oxygen, which are present in the reaction chamber and each of the piping, are controlled to become lower than $1\times10^{-9}$ atm, preferably lower than $1\times10^{-10}$ atm and lower than $10^{-21}$ atm, preferably lower than $10^{-29}$ atm, respectively by using the said water molecule/oxygen molecule discharging apparatus. Subsequently, a silicon substrate on which an $SiO_2$ film having a thickness of 1 nm has been formed by thermal oxidization is introduced into the reaction chamber, and the temperature of the wafer is heated to 400° C. Then, the below-mentioned organometallic compounds are introduced into the reaction chamber. In the present embodiment, tetrakisdimethylamidohafnium is heated to the temperature of 80° C. and introduced by way of bubbling with $N_2$ carrier gas at the flow rate of 100 sccm. At this time, both oxygen and water within the $N_2$ carrier gas are adjusted as follows: That is, the water concentration is adjusted to become smaller than 1 PPB and the oxygen partial pressure is adjusted to become lower than $10^{-21}$ atm, preferably lower than $10^{-29}$ atm and higher than $10^{-35}$ atm.

It should also be understood that as materials to be introduced, other than tetrakisdimethylamidohafnium, either tetrakisdiethylamidohafnium or tetrakisethylmethylamidohafnium may be alternatively employed. Under the said condition, a metal Hf film is deposited on the silicon substrate. It should also be noted that as the substrate to be used, a germanium substrate may be alternatively employed other than the silicon substrate. In this alternative case, Hf is directly deposited on the Ge substrate without forming the oxide sublayer. When compositions of the film are investigated with XPS, the following fact is revealed: That is, a metal Hf film without any oxygen contamination is successfully deposited. It should also be noted that when a metal Hf film is formed, silane gas or trimethylaluminum gas may be flowed at the same time so that Si or Al may be added into the Hf film. Moreover, a small amount of organometallic compounds of lanthanoids such as La may be added into the Hf film. In this case, a metal film with a small amount of Si, Al, La, or the like in addition to Hf is deposited. As achieved effects, water within the piping is considerably reduced. As a result, a considerable reduction effect is achieved in the total number of particles generated from the cylinder. In particular, an effect that the lifetime of source gas lines is prolonged several times compared with the conventional lifetime is achieved.

Subsequently, the wafer is extracted from the reaction chamber without being exposed to the atmosphere, and the metal Hf is heated in a heating furnace so as to be densified. It should also be noted that water vapor partial pressure in this transfer path and the heating furnace has been adjusted to be lower than $1\times10^{-10}$ atm in accordance with the present invention. While the $N_2$ gas having been passed through the water/oxygen molecule discharging apparatus is flowed into the heating furnace at the flow rate of 100 sccm, the metal Hf is heated at temperatures from 600° C. to 800° C. It should also be noted that for the sake of simplicity, the present step may be alternatively omitted and the Hf deposition step may be alternatively followed by the below-mentioned oxidizing step immediately. Subsequently, the film is oxidized in a nitrogen atmosphere with a controlled oxygen partial pressure so as to form a Hf-series insulating film having a high permittivity. At this time, in the case that the indicated values of the oxygen sensor are fed back to the water/oxygen molecule discharging apparatus so as to adjust the oxygen partial pressure at $10^{-20}$ atm and that the wafer where Hf has been deposited is heated, an insulating film whose physical film thickness is 4 nm and whose relative permittivity is 16 is formed on the wafer. In other words, a high permittivity insulating film having an $SiO_2$-equivalent film thickness of 1 nm is formed. When the insulating characteristic of the film is investigated, a leak current is found to reduce approximately by an order of magnitude, as compared with a case that the normal $N_2$ is employed and that neither oxygen nor water content is controlled.

When the oxygen partial pressure is set at $10^{-10}$ atm, an insulating film having a physical film thickness of 8 nm, a relative permittivity of 8, and an $SiO_2$-equivalent film thickness of 4 nm is formed, and it is revealed that there is a correlation between the equivalent film thickness and the oxygen concentration. It is revealed that when an insulating film whose film thickness has once increased to a physical film thickness of 8 nm or an equivalent film thickness of 4 nm is heated again in a nitrogen atmosphere with the water concentration being 1 PPT and the oxygen partial pressure being $10^{-35}$ atm according to the present invention, the insulating film is reduced, so that the film thickness decreases until the physical film thickness becomes 4 nm or the $SiO_2$-equivalent film thickness 1 nm. When the insulating characteristic of the film is similarly investigated, a leak current is reduced by more than an order of magnitude from the case that the normal $N_2$ is employed and that neither oxygen nor water contents is controlled.

Figure 7:
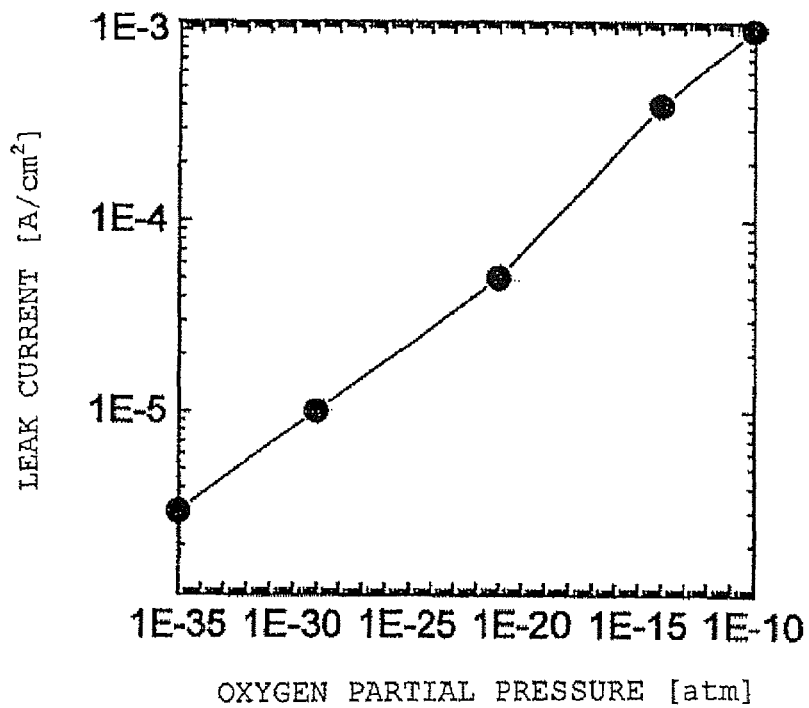
FIG. 7 is a diagram representing the relationship between the leak current of insulating films having a high permittivity and the partial pressure of oxygen contained in the carrier gas.

When an investigation is carried out as to the correlation between the leak current of the deposited film having an equivalent film thickness of 2 nm and the concentration of oxygen contained in the carrier gas when an Hf film has been deposited, the following result is obtained. That is, as represented in FIG. 7, the result is that there is a correlation between the leak current of the film and the oxygen concentration within the carrier gas and that the lower the oxygen partial pressure is, the lower the leak current of the formed film is. More specifically, in cases that the oxygen partial pressure is decreased to lower than $10^{-29}$ atm, the leak current is considerably reduced to lower than $10^{-5}$ [A/cm$^2$].

With the introduction of an extremely low water content gas into a semiconductor manufacturing apparatus as the treatment target, the water content contained in the apparatus is removed in the following method. Firstly, after the interior of the apparatus has been vacuum-exhausted with a turbo molecular pump to a pressure of approximately $10^{-5}$ atm, nitrogen gas whose oxygen partial pressure is $10^{-35}$ atm and whose water concentration is smaller than 1 PPB and larger than 0.83 PPT is introduced into the apparatus at the flow rate of 2 SLM until the apparatus is filled with the nitrogen gas for the internal pressure to become the atmospheric pressure. Subsequently, the below-mentioned operation is repeatedly carried out: That is, the introduction of the nitrogen gas is ceased, then the interior of the apparatus is again vacuum-exhausted by the turbo molecular pump to a pressure of $10^{-5}$ atm, and again the nitrogen gas is introduced into the apparatus until the internal pressure becomes the atmospheric pressure. Subsequently, after the said operation is repeatedly carried out six times in total, the vacuum apparatus is entirely exhausted by a vacuum pump.

Figure 8:
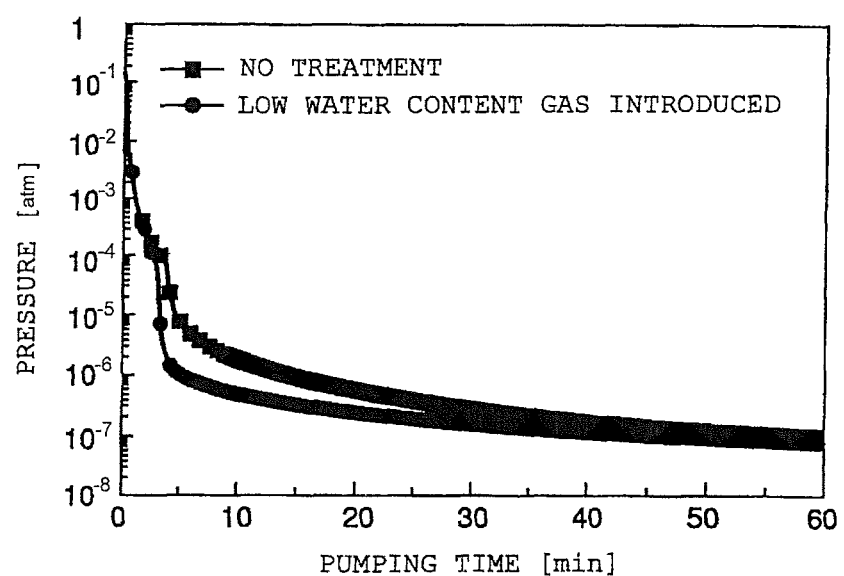
FIG. 8 is a diagram representing pumping characteristic curves from the atmospheric pressure.

FIG. 8 includes the pumping characteristic curve from the atmospheric pressure in this case. The below-mentioned fact is grasped: That is, both the pumping speed and the ultimate vacuum are improved after the extremely low water content gas has been introduced, as compared with a case that the interior of the apparatus is merely vacuum-exhausted without removing the water content by introducing the extremely low water content gas. To clarify the cause, the water content contained in the apparatus is investigated with mass spectrometry and the following fact is revealed: That is, when the extremely low water content gas according to the present invention is introduced, the water content within the vacuum processing chamber is lowered, so that the pumping speed and the ultimate vacuum are successfully improved. It should also be understood that the effect of reducing the water content manifests itself if the low water content gas according to the present invention is introduced into the chamber at least once. In addition, speaking of the kinds of usable gases, a similar water content reducing effect is achieved when such inert gases as argon, helium, and the like other than nitrogen gas, which is a most common inactive gas, are employed.

A description is made of a method for depositing a film having a high permittivity by sputtering. For sputtering, the reaction chamber for which the water vapor and oxygen partial pressures within the chamber and the interior of the entire piping have been controlled to become $1\times10^{-9}$ atm, preferably lower than $1\times10^{10}$ atm and lower than $10^{-21}$ atm, preferably lower than $10^{-29}$ atm, respectively by purging moisture with an extremely low water/oxygen content gas in advance is prepared. Argon gas whose water concentration is controlled to become smaller than 1 PPB and whose oxygen partial pressure is controlled to become lower than $10^{-21}$ atm, preferably lower than $10^{-29}$ atm and higher than $10^{-35}$ atm is introduced into the reaction chamber at the flow rate of 100 sccm. The introduced argon gas is ionized under the pressure of 1 Pa at the electric power of 200 W into plasma, with which a Hf plate as a target is bombarded for a Hf thin film to be deposited on a silicon substrate in the sputtering method. As a result, a metal Hf film within which no oxygen can be detected is manufactured. It should also be noted that if a target of silicon, aluminum, or a lanthanoid such as La is employed at the same time while the film is formed or if a small amount of the said elements have been mixed into the Hf target, a metal film with a small amount of Si, Al, or La, etc. added to Hf is deposited.

Subsequently, the wafer is extracted from the reaction chamber and the metal Hf is heat-processed in a heating furnace. While $N_2$ gas having been passed through the water molecule/oxygen molecule discharging apparatus according to the present invention is flowed into the heating furnace at the flow rate of 100 sccm, the metal Hf is heated at temperatures from 600° C. to 800° C. It should also be noted that for the sake of simplicity, the present step may be alternatively omitted and the Hf film deposition may be alternatively followed by the below-mentioned oxidizing step immediately. Subsequently, when the film is oxidized in an atmosphere with a controlled oxygen partial pressure, a Hf-series insulating film having a high permittivity is deposited on the silicon substrate in a similar manner to that of the embodiment 1.

When a wafer is heated on which Hf has been deposited while the oxygen partial pressure is adjusted so as to become $10^{-20}$ atm, such an insulating film having a high permittivity whose physical film thickness is 4 nm and whose $SiO_2$-equivalent film thickness 1 nm is formed on the wafer. When the insulating characteristic of the film is investigated, a leak current is reduced approximately by more than an order of magnitude from the case that the normal $N_2$ is employed and that neither oxygen nor water content is controlled.

[Embodiment 3]

Figure 9:
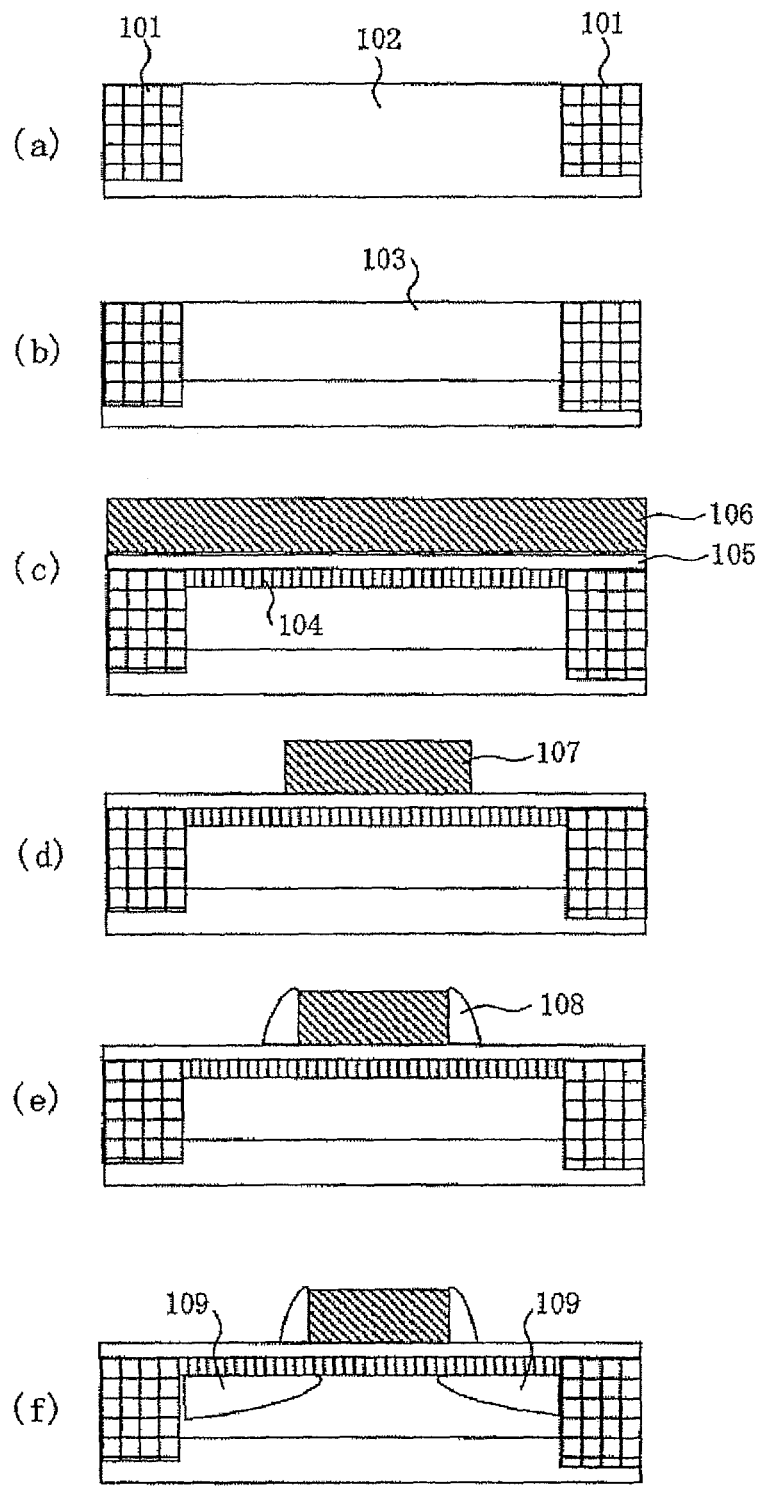
FIG. 9 is a diagram showing steps for manufacturing a MOS type field-effect transistor by depositing an insulating film having a high permittivity.

Referring now to FIG. 9, a description is made of a method for manufacturing a MOS type field-effect transistor device, in which a high-grade insulating film having a high permittivity is deposited on a silicon substrate by employing an extremely low water/oxygen content gas. In FIG. 9, firstly, trench regions 101 are formed on a silicon substrate or the like 102 by utilizing lithography and etching techniques commonly known in the technical field so as to form an STI (Shallow Trench Isolation) region. As a result, silicon is exposed only in individual transistor regions, the peripheral regions of which are covered by an insulating film (FIG. 9(a)). Thereafter, a doping layer which constitutes a well 103 is formed in the device region based upon the ion implantation technique commonly known in the technical field (FIG. 9(b)). Next, a thermal oxidation film 104 having a thickness of approximately 1 nm is firstly formed on the exposed silicon region by performing thermal oxidation; subsequently, an insulating film 105 having a high permittivity is deposited; and furthermore, a film 106 which is made of either polysilicon or metal is stacked on the insulating film (FIG. 9(c)). Next, the film is etched by performing a gate etching method commonly known in the technical field so as to form a gate electrode 107 (FIG. 9(d)). Subsequently, an ion implantation to form an extension region is carried out, followed by a further deposition of a protection film 108 on a side wall of the gate electrode (FIG. 9(e)). An ion implantation is again carried out so as to form source/drain regions 109, and finally, the resulting substrate undergoes a thermal activation process at a temperature of approximately 1050° C. so as to form a transistor (FIG. 9(f)).

It should be understood that as the silicon substrate employed in the present invention, an epitaxial-growth substrate may be employed. In the epitaxial growth of the silicon film, water vapor and oxygen partial pressures within the reaction chamber and the entire piping are adjusted to become lower than $1 \times 10^{-9}$ atm, preferably lower than $1 \times 10^{-10}$ atm and lower than $10^{-29}$ atm, preferably lower than $10^{-35}$ atm, respectively by purging water/oxygen with an extremely low water/oxygen content gas. Subsequently, a silicon substrate from which the oxidation film has been removed is introduced into the reaction chamber. Firstly, either monosilane gas or disilane gas is introduced into the vacuum reaction chamber at the flow rate of 100 sccm and at the same time, nitrogen gas having an extremely low water content according to the present invention whose water content is 2 PPT and whose oxygen partial pressure is $10^{-34}$ atm is introduced into the vacuum reaction chamber at the flow rate of 500 sccm to deposit a silicon epitaxial film on the silicon substrate under the pressure of $10^{-1}$ Pa at the substrate temperature of 800° C. It should also be understood that when either a silicon film or an insulating film having a high permittivity is talked about, it refers to the film that is deposited either directly on the surface of the substrate or further on layers that have been deposited on the substrate surface.

When an investigation is made of oxygen and water concentration contained in the films after the depositions thereof, the effect of considerably reducing the water and oxygen amounts within the silicon film is observed, so that a high quality silicon substrate having a high withstand voltage is provided. Alternatively, a germanium substrate may be used instead of a silicon substrate. In this alternative case, if germane is employed instead of disilane, a germanium thin film is epitaxially grown. Alternatively, disilane and germane may be mixed in an arbitrary ratio. In this case, a silicon germanium film is deposited on the silicon substrate. As apparent from the foregoing descriptions, thus formed substrate may be used not only for a deposition of an insulating film having a high permittivity thereon, but also, for manufacturing of a transistor using a normal gate insulating film of the normal silicon oxide formed thereon.

Industrial Applicability

The present invention is applicable in technical fields for manufacturing products with employment of low oxygen partial pressure gases, namely, in semiconductor manufacturing apparatuses, liquid crystal manufacturing apparatuses, electric/electronic component manufacturing apparatuses, and food manufacturing apparatuses.

The invention claimed is:

1. A thin film deposition method comprising:
   a step for supplying a gas whose water concentration has been controlled to become smaller than 1 PPB, and whose oxygen partial pressure has been controlled to become lower than $10^{-21}$ atm by a water/oxygen molecule discharging apparatus into the interior of a reaction chamber and carrying out a dehydration/deoxidation process in the interior of said reaction chamber so as to control water vapor partial pressure to become lower than $10^{-10}$ atm;
   a step for depositing a metal film on a substrate by supplying a carrier gas or a plasma excitation gas whose water concentration has been controlled to become smaller than 1 PPB and whose oxygen partial pressure has been controlled to become lower than $10^{-21}$ atm into the interior of said reaction chamber; and
   a step for forming an insulating film on the wafer by oxidizing the metal film in a low-oxygen atmosphere whose oxygen partial pressure has been controlled to become lower than $10^{-20}$ atm.

2. The thin film deposition method as claimed in claim 1, further comprising:
   a step for performing a heating process within a gas whose water concentration has been controlled to become smaller than 1 PPB and whose oxygen partial pressure has been controlled to become lower than $10^{-21}$ atm and higher than $10^{-35}$ atm after said metal film has been deposited.

3. The thin film deposition method as claimed in claim 2, further comprising:
   a step to thermally oxidize said deposited film by employing an inert gas whose oxygen partial pressure has been controlled to become the value wherein only the deposited metal film is oxidized, leaving the substrate unoxidized or deoxidizing the oxide substrate, after said heating process in claim 2 has been carried out.

4. The thin film deposition method according to claim 1, wherein the oxygen partial pressure of the gas supplied to the interior of the reaction chamber is lower than $10^{-29}$ atm and higher than $10^{-35}$ atm.

5. The thin film deposition method according to claim 1, wherein the metal film deposited on the substrate is hafnium (Hf).

6. The thin film deposition method according to claim 1, wherein silicon, aluminum, or a lanthanoid may be added to the metal film.

\* \* \* \* \*